United States Patent [19]
Hsu

[11] Patent Number: 5,480,823
[45] Date of Patent: Jan. 2, 1996

[54] METHOD OF MAKING HIGH DENSITY ROM, WITHOUT USING A CODE IMPLANT

[75] Inventor: Chen-Chung Hsu, Taichung, Taiwan

[73] Assignee: United Microelectronics Corporation, Hsinchu, Taiwan

[21] Appl. No.: 374,966

[22] Filed: Jan. 19, 1995

[51] Int. Cl.[6] ............................................. H01L 21/8246
[52] U.S. Cl. ............................ 437/48; 437/69; 437/203
[58] Field of Search ................................ 437/45, 48, 69, 437/203

[56] References Cited

U.S. PATENT DOCUMENTS

| | | | |
|---|---|---|---|
| 4,648,937 | 3/1987 | Ogura et al. | 437/233 |
| 5,108,937 | 4/1992 | Tsai et al. | 437/40 |
| 5,236,853 | 8/1993 | Hsue | 437/43 |
| 5,306,657 | 4/1994 | Yang | 437/48 |
| 5,308,777 | 5/1994 | Hong | 437/41 |
| 5,342,796 | 8/1994 | Ahn et al. | 437/203 |
| 5,393,704 | 2/1995 | Huang et al. | 437/203 |

*Primary Examiner*—Chandra Chaudhari
*Attorney, Agent, or Firm*—George O. Saile

[57] ABSTRACT

A method of fabricating read only memory, (ROM), devices has been developed. This process is accomplished using self-alignment of buried N+ bit lines. Thick field oxides are used for isolation purposes. The programmable cell is obtained by growing a gate oxide in a region in which the thick field oxide has been removed. The non-programmable cells contain thick gate oxides. Polysilicon gate structures are processed to function as the word lines.

20 Claims, 4 Drawing Sheets

METHOD OF MAKING HIGH DENSITY ROM, WITHOUT USING A CODE IMPLANT

FIELD OF THE INVENTION

The present invention relates to a simpled process for fabricating, read only memory, (ROM), devices, using recessed gates, that are manufactured with the use of self-aligned source and drain bit lines and recessed oxide technology.

DESCRIPTION OF PRIOR ART

The major objective of the semiconductor industry is to continually improve chip performance, while still being able to continue cost reduction. The ability to place more chips, on a specific sized wafer, does help in reducing the cost per chip. This is accomplished by reducing key chip features, allowing denser semiconductor devices, that is a greater number of circuits per chip to be realized, and thus resulting in many more smaller and faster, chips per wafer. In addition performance enhancements are also achieved by reducing chip size. For example shorter channel lengths and shorter wiring runs have allowed metal oxide semiconductor field effect transistor, (MOSFET), technologies to become competitive with bipolar technologies.

Efforts to increase device density, by reducing specific device dimensions, were initially accomplished by the rapid evolution of the photolithograhy discipline. Improved optics and the development of very sensitive organic photoresist materials, have resulted in sub-micrometer images to be routinely obtained. Other semiconductor fabrication processes, such as reactive ion etching, (RIE), and ion implantation, (I/I), have also contributed to the achievement of reduced chip dimensions. In addition, recent semiconductor processing techniques, have also been a major factor in microminiturazation. For example in U.S. Pat. No. 4,648,937, Ogura, et al, describe a "spacer" or sidewall process, using a combination of chemical vapor deposition, (CVD), and RIE, that allows smaller dimensions to be achieved. In U.S. Pat. No. 5,108,937, Tsai et al, illustrate a process of removing a recessed oxide and using the exposed silicon for subsequent devices. This process also allows reductions in chip size to occur.

The combination of using advanced tools, photolithoghy, RIE, etc, and the new process sequences, sidewall spacers, etc, can be effectively used to build high density read only memory, (ROM), structures. The buried bit line process, usually accomplished by a heavy N+ I/I step, has been used extensively in ROM products. The programmable cell in turn, is usually achieved by a heavy I/I of P type dopant, in an area between two adjacent N+ bit lines. As the dimension of the programmable cell, or the space between the adjacent bit lines decrease, the counterdoping of the P type cell, form the adjacent N+ bit lines, becomes more significant, and adversly influences the performance of the device. Hong, in U.S. Pat. No. 5,308,777, describes a process that reduces the counterdoping effect. However the process adds more complexity, and thus cost to the final product.

The invention now described will show a simplified process for fabricating ROM devices, eliminating the need for a P type I/I, programmable cell, and using the recessed oxide technology as a major component of this ROM process.

SUMMARY OF THE INVENTION

It is an object of this invention to provide a method of fabricating an improved ROM device with a minimum of process steps.

It is another object of this invention to use self-alignment techniques to achieve the source and drain regions.

It is still another object of this invention to use an area of removed recessed oxide, for the programmable cell.

It is still yet another object of this invention to use a thin gate oxide as part of the programmable cell.

In accordance with the present invention a method is described for fabricating ROM devices in which recessed or field oxide, (FOX), regions are grown, followed by a self-aligned N+ I/I, into the spaces between the FOX regions, for purposes of creating the buried bit lines of the ROM device. The specific cells, needed for the programmable cell, are next subjected to a FOX removal process. Thin gate oxides are then regrown in the programmable cell channel region followed by polysilicon deposition, doping and pattterning to form the gate structure.

BRIEF DESCRIPTION OF THE DRAWINGS

The object and other advantages of this invention are best explained in the preferred embodiment reference to the attached drawing that include.

DESCRIPTION OF THE PREFERRED EMBODIMENTS

The method of forming the ROM cell, without the use of a code ion implantation step, will now be described in detail. This structure can be used as a part of MOSFET chips that are now being manufactured in industry, therefore only the specific areas unique to understanding this invention will be described in detail.

Figure 1:
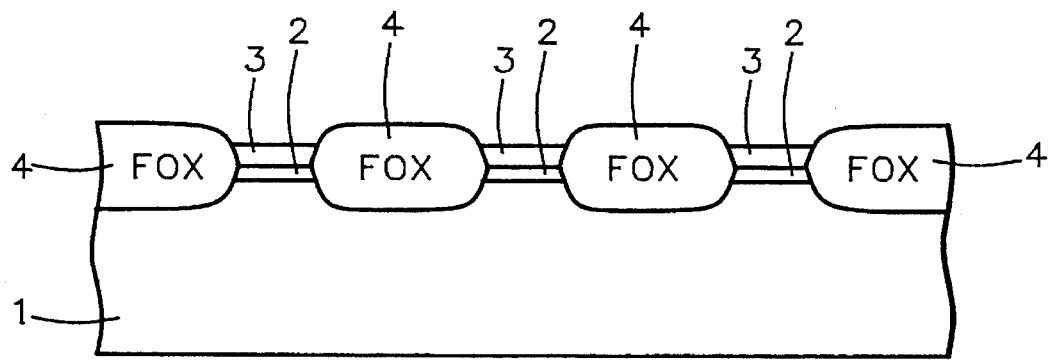
FIGS. 1–2, which schematically illustrate a fabrication sequence, used to obtain a specific N+ bit line dimension.
Figure 2:
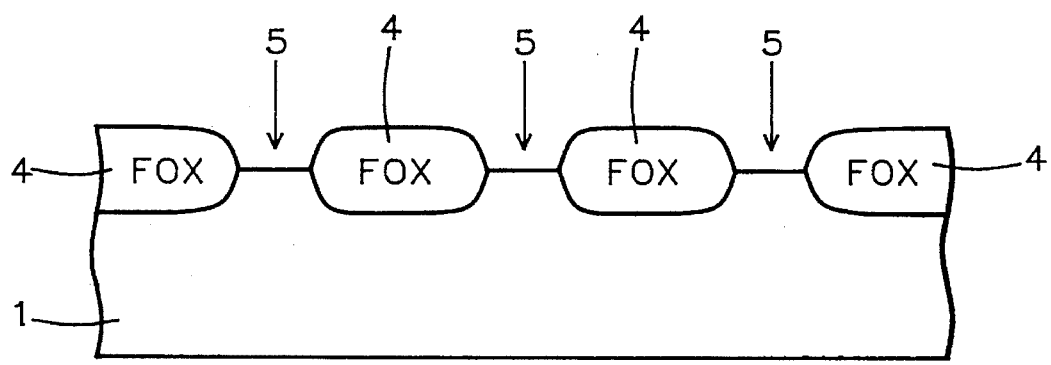

Referring now to FIG. 1, a substrate, 1, composed of P type single crystal silicon, with a <100> orientation, is used. A thin pad oxide, 2, between about 200–1000 Angstroms in thickness, is thermally grown, followed by a low pressure chemical vapor deposition, (LPCVD), of silicon nitride, 3, to a thickness of between about 500–1500 Angstroms. Standard photolithogaphy processing is then used to create an image in the photoresist, and this photoresist shape is in turn transferred to the underlying silicon nitride—silicon dioxide layers via reactive ion etching, (RIE). After photoresist removal, followed by wet organic and inorganic cleans, a thick field oxide, 4, (FOX), is thermally grown at a temperature of between about 800° to 950° C., to a thickness of between about 4000 to 6000 Angstroms. At this stage the the oxidation masking silicon nitride, 3, and the pad oxide, 2, layers are removed via use of a hot phosphoric acid treatment, followed by a buffered hydrofluoric acid process. This is shown schematically in FIG. 2. The region of exposed silicon, 5, located between FOX regions, will be subsequently used, in a self-alignment scheme, to produce the buried N+ bit lines.

Figure 3:
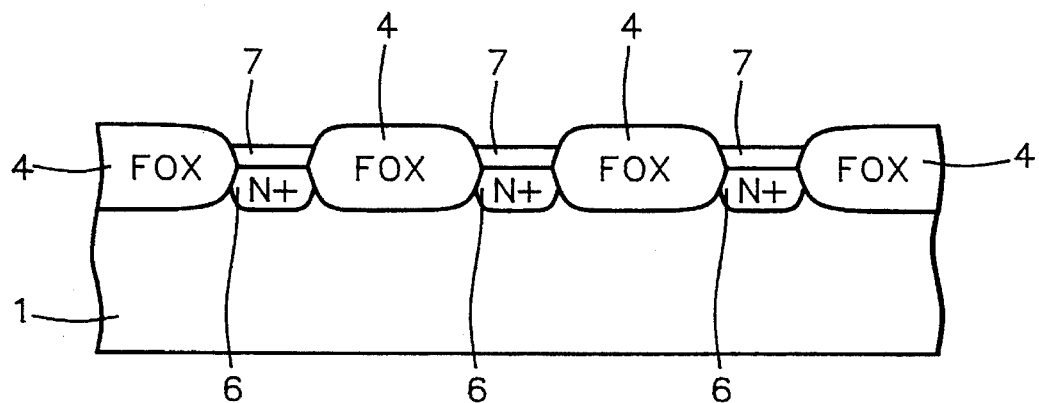
FIGS. 3–6, which schematically represent, in cross-sectional form, the key fabrication stages of this invention.

A self-aligned, buried N+ bit line process is now performed, using ion implantation of arsenic at an energy of between about 50 to 100 Kev., at a dose of between about 1E14 to 1E16 atoms/cm2, and phosphorous at an energy of between about 20 to 60 Kev., at a dose of between about 1E14 to 1E16 atoms/cm2. The N+ bit lines, 6, are shown schematically in FIG. 3. Again it should be noted that this step is performed using a self-alignment scheme. That is the width of the N+ bit lines were not directly defined using photolithography, but were created by ion implantation of the exposed silicon regions, while the remaining silicon areas are masked by FOX regions, 4. Next an oxidation step is performed at a temperature of between about 900° to 1000° C., in order to grow a thickness of between about 500 to 1000 Angstroms of silicon dioxide, 7, on the N+ bit lines, 6. This is shown in FIG. 3.

Figure 4:
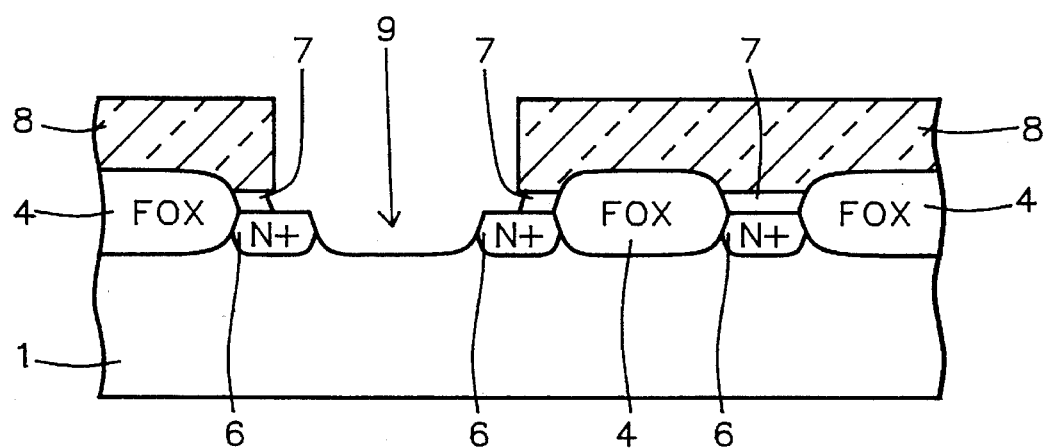
Figure 5:
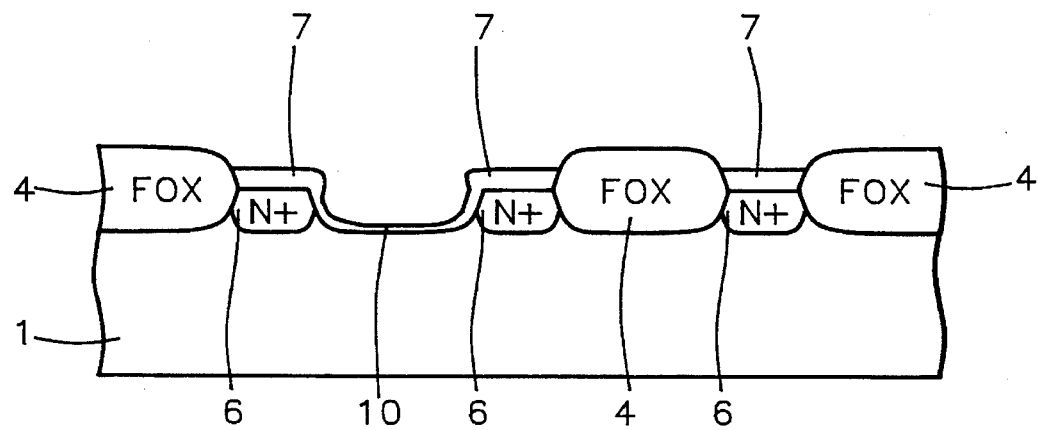

The process to create the programmable cell now is now initiated. Photolitography, 8, is used to expose region 9, followed by removal of the FOX insulator using a buffered hydrofluoric acid solution. This is shown in FIG. 4. It can also be seen that the exposed region of oxide layer, 7, ovelying the N+ bit lines, is also removed. However subsequent oxidation processes will result in a regrowth of this passivation film. After removal of photoresist, and careful wet cleans, a gate oxide, 10, is grown at a temperature between about 800° to 1000° C., to a thickness between about 100 to 300 Angstroms. It should also be noted that the portion of oxide, 7, removed in the previous buffered hydrofluoric acid step, is now regrown during the gate oxidation process. This can be seen in FIG. 5.

Figure 6:
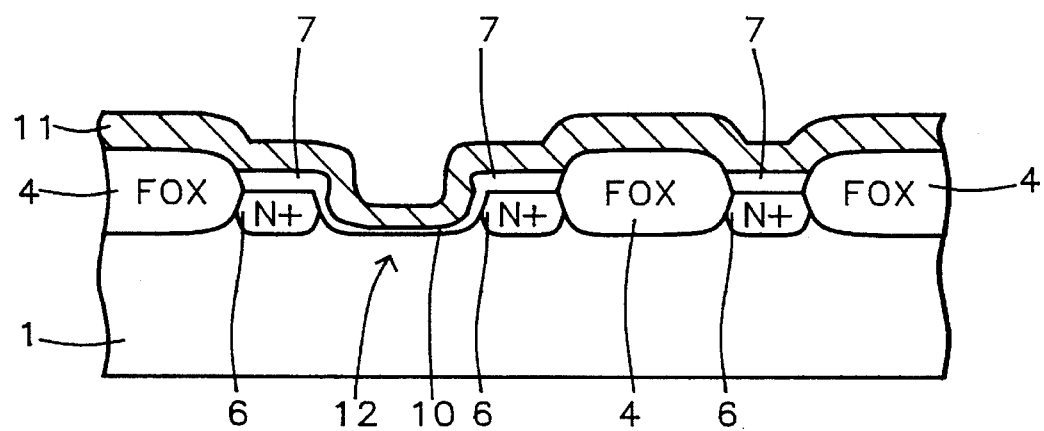
Figure 7:
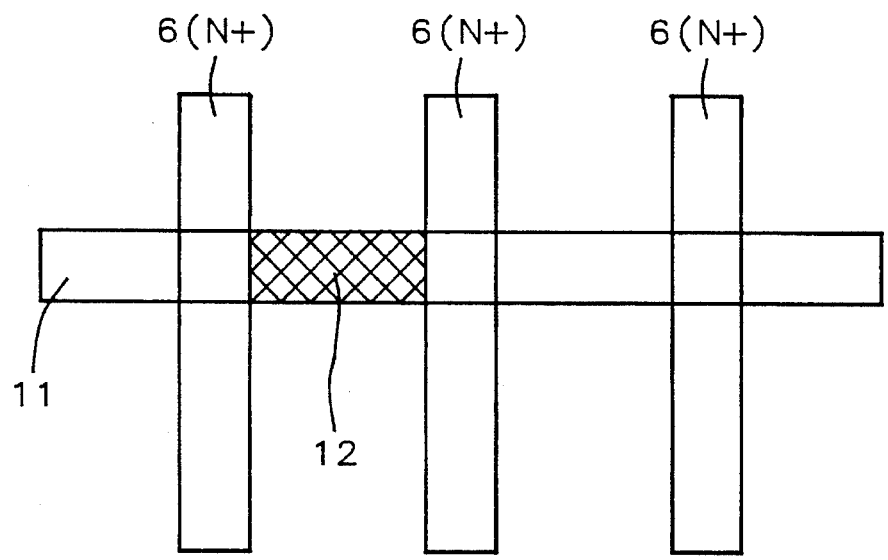
FIG. 7, a top view of the ROM cell, fabricated using this invention.

Next the word line structure is fabricated by first depositing polysilicon, using LPCVD techniques, to a thickness of between about 1000 to 3000 Angstroms. Ion implantation of phosphorous, at an energy between about 30 to 80 Kev., at a dose between about 1E14 to 1E16 atoms/cm2, is used to dope the polysilicon, and photohithography and RIE processing are used to create the polysilicon word line structure, 11, shown schematically in FIG. 6. It can be seen that the programmable cell, 12, is differentiated from the non-programmable counterparts, by a significant difference in gate oxide thickness, thus significant differnces in turn on voltages exist. FIG. 7 illustrates a top view of this structure.

Figure 8:
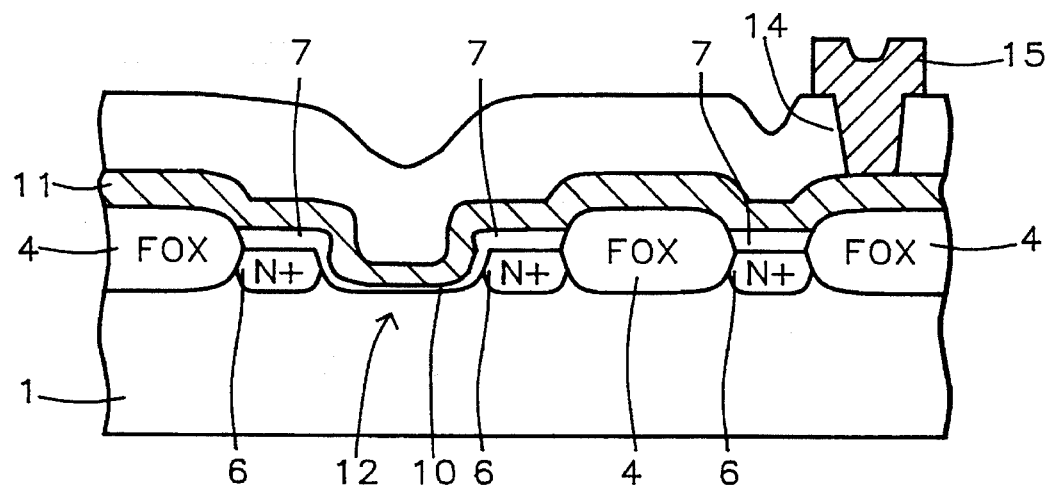
FIG. 8, which schematically illustrates a cross-section of a metallized ROM cell.

Finally a silicon oxide layer, 13, is deposited to a thickness of between about 5000 to 8000 Angstroms, followed by photolithography and RIE processing, to create via, 14, to the polysilicon word line, 11, and to the N+ bit line, 6, (not shown). Contact metallurgy is achieved via metal sputtering of aluminum to a thickness of between about 6000 to 12000 Angstroms, followed by conventional photolithography and RIE processing to produce metal contact, 15, shown schematically in FIG. 8.

The process used to create the ROM device, witout a code ion implant step, can be applied to P type, (PMOSFET), as well as N type, (NMOSFET), read only memory chips. This procedure can also be applied to complimentary metal oxide silicon, (CMOS), as well as to bipolar-CMOS, (BiCMOS), devices.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a read only memory, (ROM), cell on a semiconductor substrate comprising the steps of:

forming a field oxide pattern on specific regions of said substrate, while leaving exposed silicon on remaining regions of said substrate;

ion implanting first conductivity imparting dopants into said exposed silicon regions;

growing an oxide on said exposed, ion implanted silicon regions;

photolithography to expose a specific field oxide region;

removal of oxide from said specific field oxide region, to leave bare silicon;

growing a gate oxide on said bare silicon;

depositing a polysilicon layer on said gate oxide, on said field oxide regions, and on said oxide, grown on said exposed, ion implanted silicon;

ion implanting a first conductivity imparting dopant into said polysilicon layer; and patterning to form polysilicon gate structures on said gate oxide, on said field oxide, and on said oxide, grown from said exposed, ion implanted silicon.

2. The method of claim 1, wherein said field oxide is grown at a temperature between about 800° to 950° C., to a thickness of between about 4000 to 6000 Angstroms.

3. The method of claim 1, wherein said first conductivity imparting dopants are ion implanted into said exposed silicon regions, self aligned to said field oxide regions.

4. The method of claim 1, wherein said first conductivity imparting dopants are arsenic, ion implanted at an energy between about 50 to 100 Kev., at a dose between about 1E14 to 1E16 atoms/cm2, and phosphorous, ion implanted at an energy between about 20 to 60 Kev., at a dose between about 1E14 to 1E16 atoms/cm2.

5. The method of claim 1, wherein said oxide, is grown on said exposed, ion implanted silicon regions, at a temperature of between about 900° to 1000° C., to a thickness between about 500 to 1000 Angstroms.

6. The method of claim 1, wherein said specific field oxide region is removed using buffered hydrofluoric acid.

7. The method of claim 1, wherein said gate oxide is grown in the area where said specific field oxide region was removed, at a temperature between about 800° to 1000° C., to a thickness of between 100 to 300 Angstroms.

8. The method of claim 1, wherein said polysilicon layer is deposited to a thickness between about 1000 to 3000 Angstroms.

9. The method of claim 1, wherein said first conductivity imparting dopant is phosphorous, ion implanted at an energy between about 30 to 80 Kev., at a dose between about 1E14 to 1E16 atoms/cm2.

10. The method of claim 1, wherein said polysilicon gate structures are formed, by anisotropic reactive ion etching, on said gate oxide, on said field oxide, and on said oxide grown from said exposed, ion implanted silicon.

11. A method of fabricating a read only memory, (ROM), cell on a semiconductor substrate comprising the steps of:

forming a field oxide pattern on specific regions of said substrate, while leaving exposed silicon on remaining regions of said substrate;

ion implanting first conductivity imparting dopants into said exposed silicon regions to form buried bit lines of the ROM cell;

growing an oxide on said buried bit line regions;

photolithography to expose a specific field oxide region;

removal of oxide from said specific field oxide region, to leave bare silicon;

growing a gate oxide on said bare silicon;

depositing a polysilicon layer on said gate oxide, on said field oxide regions, and on said oxide over said buried bit line regions;

ion implanting a first conductivity imparting dopant into said polysilicon layer; and patterning said polysilicon layer to form word lines, on said gate oxide, on said field oxide regions, and on said oxide over said buried bit line regions.

12. The method of claim 11, wherein said field oxide is grown at a temperature between about 850° to 950° C., to a thickness between about 4000 to 6000 Angstroms.

13. The method of claim 11, wherein said buried bit line regions are self aligned to said field oxide regions, by ion implanting said first conductivity imparting dopants into said exposed silicon region.

14. The method of claim 11, wherein said first conductivity imparting dopants are arsenic, ion implanted at an energy between about 50 to 100 Kev., at a dose between about 1E14 to 1E16 atoms/cm2, and phosphorous, ion implanted at an energy between about 20 to 60 Kev., at a dose between about 1E14 to 1E16 atoms/cm2.

15. The method of claim 11, wherein an oxide is grown on said buried bit line regions, at a temperature between about 900° to 1000° C., to a thickness of between about 500 to 1000 Angstroms.

16. The method of claim 11, wherein said specific field oxide region is removed using buffered hydrofluoric acid.

17. The method of claim 11, wherein said gate oxide is grown, in the area where said specific field oxide region was removed, at a temperature between about 800° to 1000° C., to a thickness between about 100 to 300 Angstroms.

18. The method of claim 11, wherein said polysilicon layer is deposited to a thickness between about 1000 to 3000 Angstroms.

19. The method of claim 11, wherein said first conductivity imparting dopant is phosphorous, ion implanted at an energy between about 30 to 80 Kev., at a dose between about 1E14 to 1E16 atoms/cm2.

20. The method of claim 11, wherein said word lines are formed by anisotropic reactive ion etching of said polysilicon layer.

\* \* \* \* \*